United States Patent [19]
Fry

[11] Patent Number: 6,127,661
[45] Date of Patent: Oct. 3, 2000

[54] DYNAMIC THERMAL CONTROL FOR OVENIZED OSCILLATORS

[75] Inventor: Steven J. Fry, Carlisle, Pa.

[73] Assignee: CTS Corporation, Elkhart, Ind.

[21] Appl. No.: 09/287,779

[22] Filed: Apr. 7, 1999

[51] Int. Cl.⁷ .............................. H05B 1/02; H03B 1/00
[52] U.S. Cl. ............................................. 219/497; 331/69
[58] Field of Search .................... 219/210, 395, 219/397, 412, 413, 490, 494, 497, 509, 510; 331/66, 69, 70, 175, 176, 116 R, 116 FE; 310/314, 315, 318, 343

[56] References Cited

U.S. PATENT DOCUMENTS

| | | | |
|---|---|---|---|
| 3,158,821 | 11/1964 | Sulzer | 331/69 |
| 4,216,371 | 8/1980 | Marotel | 219/501 |
| 4,317,985 | 3/1982 | Wilson . | |
| 4,396,892 | 8/1983 | Freking et al. . | |
| 4,454,483 | 6/1984 | Baylor | 331/66 |
| 4,839,613 | 6/1989 | Echols et al. . | |
| 4,985,687 | 1/1991 | Long | 331/69 |
| 5,659,270 | 8/1997 | Millen et al. | 331/69 |
| 5,729,181 | 3/1998 | Cutler et al. . | |
| 6,049,256 | 4/2000 | Fry | 331/69 |

*Primary Examiner*—Sang Paik
*Attorney, Agent, or Firm*—Mark P. Bourgeois; Mark W. Borgman

[57] ABSTRACT

A heater control system for ovenized oscillators that is capable of changing the relative influence of multiple temperature sensors in order to keep a uniform temperature profile across the oscillator enclosure. A resonator is located near a heater in an enclosure. Several temperature sensors are located in proximity to the resonator for sensing temperature. One of the sensors is closer to the heater and another sensor is closer to an outer wall of the enclosure. A control circuit is connected between the sensors and the heater to provide a control signal to the heater, in response to the sensors. An adjustment circuit is connected to each of the sensors, for adjusting the relative influence that each sensor has on the control circuit.

23 Claims, 8 Drawing Sheets

DYNAMIC THERMAL CONTROL FOR OVENIZED OSCILLATORS

BACKGROUND OF THE PREFERRED EMBODIMENT(S)

1. Field of the Preferred Embodiment(s)

This invention generally relates to ovenized oscillators which provide a stable reference source or frequency in computers or other electronic equipment. Specifically, there is a heater control system that is capable of changing the relative influence of multiple temperature sensors in order to keep a constant temperature at the resonator.

2. Description of the Related Art

Various devices are well known for providing a reference frequency or source such devices are called oscillators. The oscillator typically has a quartz crystal or other resonator and also has electronic compensation circuitry to stabilize the output frequency. Ovenized oscillators heat the temperature sensitive portions of the oscillator which is isolated from the ambient to a uniform temperature to obtain a more stable output. Ovenized oscillators contain a heater, a temperature sensor and circuitry to control the heater. In order to achieve the highest thermal gain, ($G_t = \Delta T_{ambient}/\Delta T_{xtal}$) for an ovenized oscillator assembly, it is necessary to precisely determine the optimum location for the thermistor or temperature sensor that provides feedback to the oven control circuit. With a well designed thermal control circuit, the temperature change at the sensor will be essentially zero. This control point will ideally be located on the same thermal contour or gradient line as the crystal blank or resonator, thus reducing the temperature change that is seen by the crystal to minimize the resultant frequency shift.

If the control point is coupled too tightly to the heat source of the oven, the crystal or thermal load will be under-compensated and the temperature of the load will move in the same direction as the ambient. (i.e. the crystal temperature will increase as the ambient increases.) Conversely, if the sensor is coupled too closely to the ambient temperature, the assembly will be over-compensated and the crystal temperature will decrease as the ambient increases. If this control point or thermal pivot is located at the crystal blank itself, the thermal gain will be maximized.

Since it is not physically practical to locate the sensor on the crystal blank itself, the optimal location external to the crystal must be determined. Determining this point exactly can be difficult, even with thermal modeling of the assembly. Tuning the gain by physical movement of the sensor and repeated temperature testing by trial and error is often necessary. Even after this procedure has been completed on a particular design, unit to unit variations in the thermal characteristics of the assemblies will degrade the thermal gain. By using more than one sensor and properly choosing their locations, using the average output will minimize variations, but the gain may still degrade from unit to unit. Attempts have been made to utilized multiple heaters surrounding the crystal. Unfortunately, these have the same positioning problems as single heaters and incur a cost penalty of the additional heaters. The small size requirements of ovenized oscillators also discourage adding additional heaters. The size requirements for electronic components are decreasing and at the same time circuit densities are required to increase, especially for portable electronics.

Despite the advantages of the prior art oscillators, they have not allowed the user to repeatedly and easily control the temperature profile in an ovenized assembly.

Description of Incorporated Art

Examples of patents related to the present invention are as follows, wherein each patent is herein incorporated by reference for related and supporting teachings:

U.S. Pat. No. 4,396,892, is a crystal oven.

U.S. Pat. No. 4,317,985, dual heater crystal oven.

U.S. Pat. No. 4,839,613, is a temperature compensation for a frequency standard.

U.S. Pat. No. 5,729,181, is a high thermal gain oven.

The foregoing patents reflect the state of the art of which the applicant is aware and are tendered with the view toward discharging applicants' acknowledged duty of candor in disclosing information that may be pertinent in the examination of this application. It is respectfully stipulated, however, that none of these patents teach or render obvious, singly or when considered in combination, applicants' claimed invention.

SUMMARY OF THE PREFERRED EMBODIMENT(S)

It is a feature of the invention to provide an ovenized oscillator that has a stable reference source or frequency. A heater control system is capable of changing the relative influence of multiple temperature sensors in order to keep a constant temperature profile at the resonator or temperature sensitive portion of the oscillator.

A further feature of the invention is to provide an ovenized oscillator which includes a resonator and a heater. Several temperature sensors are located in proximity to the resonator for sensing temperature. A control circuit is connected between the sensors and the heater for providing a control signal to the heater, in response to the sensors, that provides power to the heater proportional to the temperature differential between the ambient and the oven set point. An adjustment circuit is connected to each of the sensors, for adjusting the relative influence that each sensor has on the control circuit. The control circuit includes several amplifiers that are connected to each sensor. Each amplifier has an amplifier output signal. A summing amplifier is connected between the temperature sense amplifier and the heater to receive the amplifier output signals and a set point signal as an input and provide the control signal as an output to the heater. The circuit that adjusts the ratio of influence of the temperature sensors is an adjustable voltage source or a variable resistor. The temperature sensors are thermistors. One of the temperature sensors is located near the heater. Another temperature sensor is located closer to the outside wall of the housing or enclosure.

A further feature of the invention is to provide a heater control circuit for an ovenized oscillator assembly that provides a uniform temperature distribution across the critical portions of an oscillator assembly, including a resonator and a heater that is located in proximity to the resonator. Several temperature sensors are located in proximity to the resonator, for sensing temperature. A control circuit is connected between the temperature sensors and the heater for providing a control signal to the heater, in response to the temperature sensors, that is proportional to the power required to maintain the oven at a constant temperature. An adjustment circuit is connected between the sensors and the control circuit for adjusting the relative influence that each sensor has on the control circuit.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

BRIEF DESCRIPTION OF THE DRAWINGS

These and other features of the invention can best be understood by the following description of the accompanying drawings as follows.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. The invention will be described with additional specificity and detail through the accompanying drawings.

DETAILED DESCRIPTION OF THE PREFERRED EMBODIMENT

Figure 1:
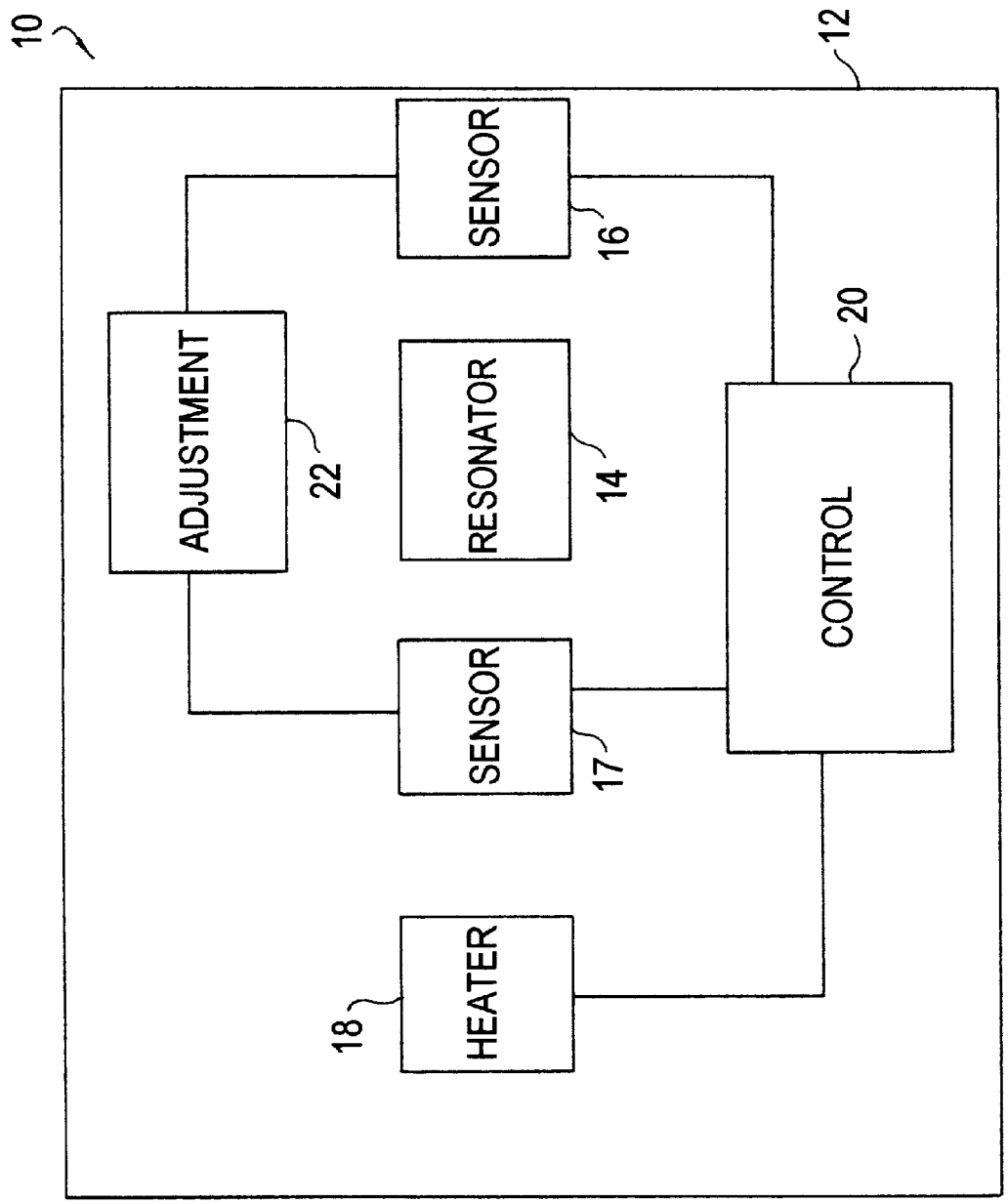
FIG. 1 is a diagrammatic view of the preferred embodiment of the invention.

Referring to FIG. 1, a diagrammatic view of a Dynamic Thermal Control for Ovenized Oscillators is shown. Ovenized oscillator assembly 10 includes an insulated housing 12 which contains the oscillator components. A resonator 14 such as a crystal or SAW device is located inside housing 12. Resonator 14 would be connected to conventional oscillator circuitry, (not shown), on a printed circuit board or ceramic substrate, (not shown), to allow resonator 14 to oscillate and provide a stable reference frequency. A temperature sensor 16 is located between resonator 14 and housing 12. Another temperature sensor 17 is located between resonator 14 and a heater 18. The temperature sensors 16 and 17 monitor the temperature of resonator 14. Heater 18 is typically a transistor in which the dissipated power is proportionally controlled to heat and maintain a constant temperature inside housing 12.

Connected to sensors 16 and 17 and heater 18 is a control circuit 20 which controls heater 18. Control circuit 20 receives a temperature signal as an input from both sensors 16 and 17 and provides a heater control signal as an output. Connected to sensors 16 and 17 is an adjustment circuit that is operable to individually change the magnitude of either of the temperature signals. In other words, adjustment circuit 22 changes the relative influence that each sensor has on control circuit 20. Instead of averaging the temperature signals from sensor 16 and 17, the adjustment circuit allows for changing the ratio of importance of that each sensor has on the control circuit. For example, after an oscillator has been assembled and tested it may be found that the oscillator provides the most stable frequency output if 70 percent of the temperature signal input comes from sensor 16 and 30 percent from sensor 17. The adjustment circuit allows for this change to be made. The relative ratio of influence would typically be set in the adjustment circuit at the factory when the oscillator is made.

Figure 2:
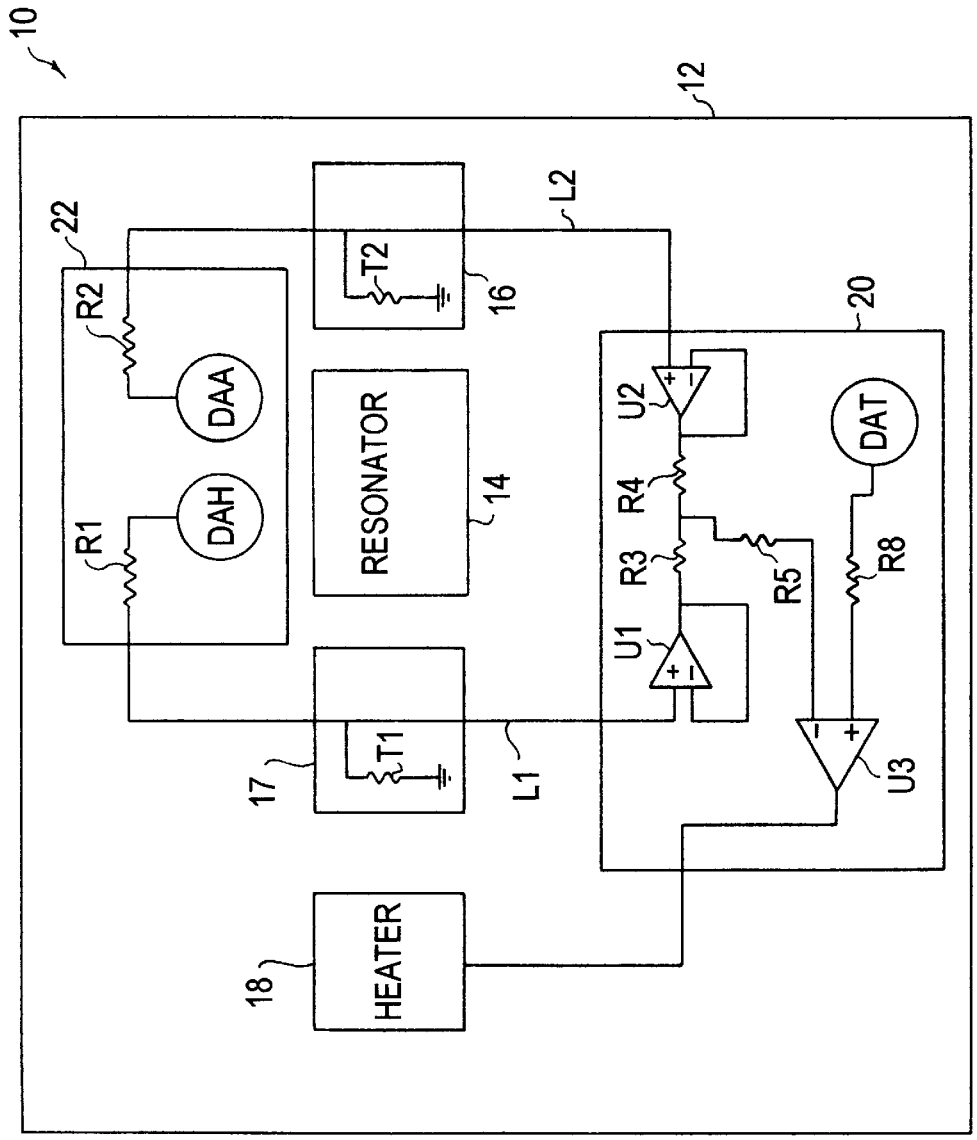
FIG. 2 is a more detailed view of the preferred embodiment of FIG. 1.

FIG. 2 shows details of the preferred control circuit and adjustment circuit of FIG. 1. Thermistors 16 and 17 are conventional negative coefficient thermistors T1 and T2. Thermistors T1 and T2 have one end connected to ground and the other end connected to circuit lines L1 and L2 that are connected between adjustment circuit 22 and control circuit 20. The thermistors output a temperature signal. Adjustment circuit 22 is a digital to analog converter DAA and DAH which outputs adjustable voltage levels and is connected through resistors R1 and R2 to sensors 16 and 17, respectively. Digital to analog converter DAA and DAH would be connected to a computer (not shown) during manufacturing to adjust the voltage levels of the temperature signals going to control circuit 20. Control circuit 20 includes op amps U1 and U2 connected in a voltage follower configuration into the negative inputs. Circuit lines L1 and L2 are connected to the positive inputs. The outputs of U1 and U2 are connected through resistors R3 and R4, respectively to input resistors R5. Resistor R5 is connected to the negative input of op amp U3 which functions as a control loop amplifier. Digital to analog converter DAT is connected through resistor R8 to the positive input of op amp U3. Digital to analog converter DAT is used during manufacturing to set the voltage level at which op amp U3 controls. The output of op amp U3 is connected to heater 18. During manufacturing, the completed assembly is powered on and allowed to warm up. The frequency output of crystal 14 is monitored and DAA, DAH and DAT are adjusted to optimize the frequency stability over the operating temperature range.

Figure 3:
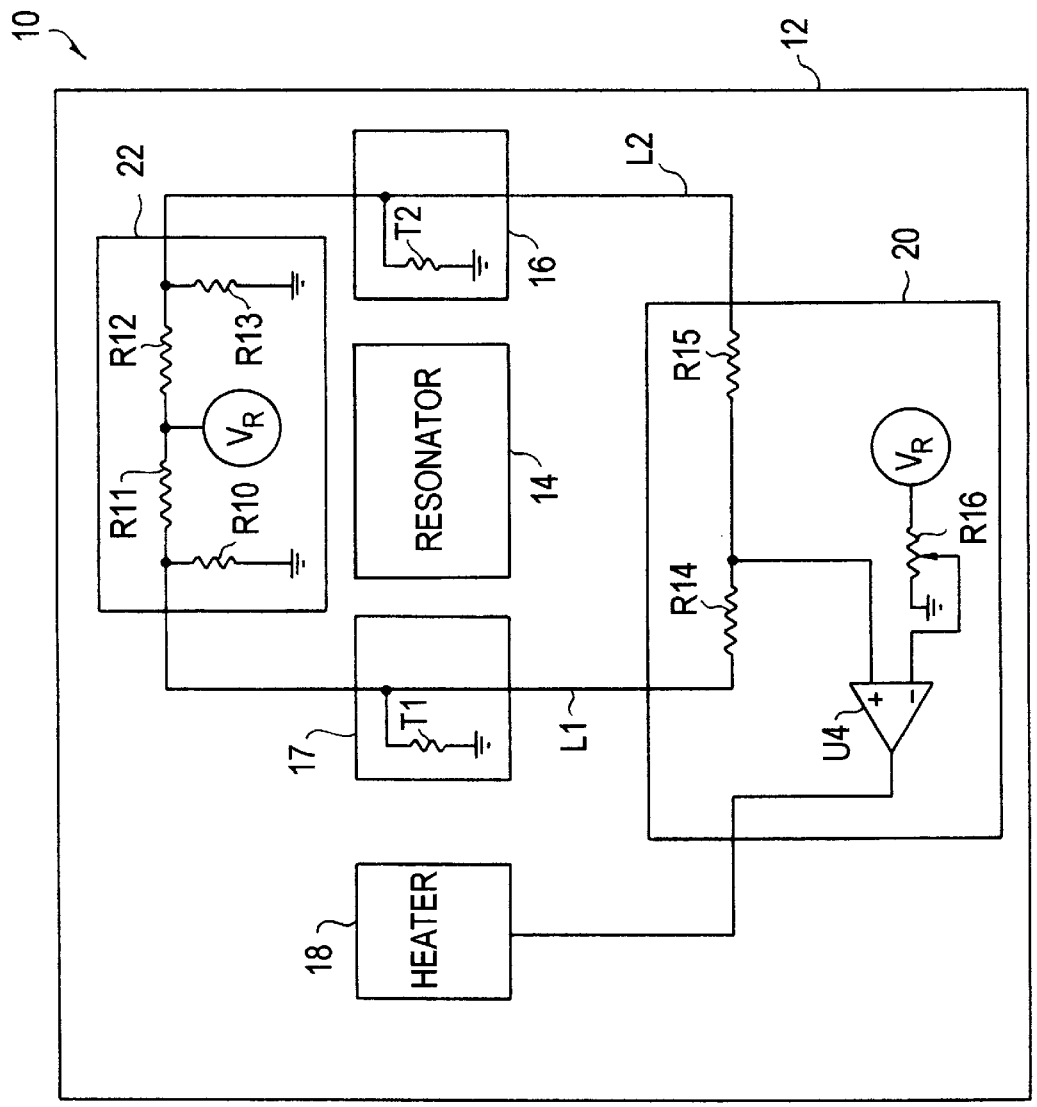
FIG. 3 is a detailed view showing an alternative embodiment of FIG. 1.

FIG. 3 is a detailed view showing an alternative embodiment of FIG. 1. Thermistors T1 and T2 have one end connected to ground and the other end connected to circuit lines L1 and L2 that are connected between adjustment circuit 22 and control circuit 20. The thermistors output a temperature signal. Adjustment circuit 22 has a fixed voltage source Vr that is connected through resistors R11 and R12 to resistors R10 and R13 and thermistors T1 and T2, respectively. Resistors R10 and R13 are selected during manufacturing to adjust the relative voltage levels of the temperature signals going to control circuit 20. Control circuit 20 includes resistors R14 and R15 which have ends connected to circuit lines L1 and L2, respectively. The other ends of resistors R14 and R15 are commoned and connected to the positive input of op amp U4 which functions as the loop amplifier. Voltage source Vr is connected through a variable resistor R16 to the negative input of op amp U4. Resistor R16 is used during manufacturing to set the voltage operating level at which op amp U4 controls. The output of op amp U4 is connected to heater 18. During manufacturing, the completed assembly is powered on and allowed to warm up. The frequency output of the crystal is monitored and resistors R10, R13 and R16 are adjusted to optimize the frequency stability.

Figure 4:
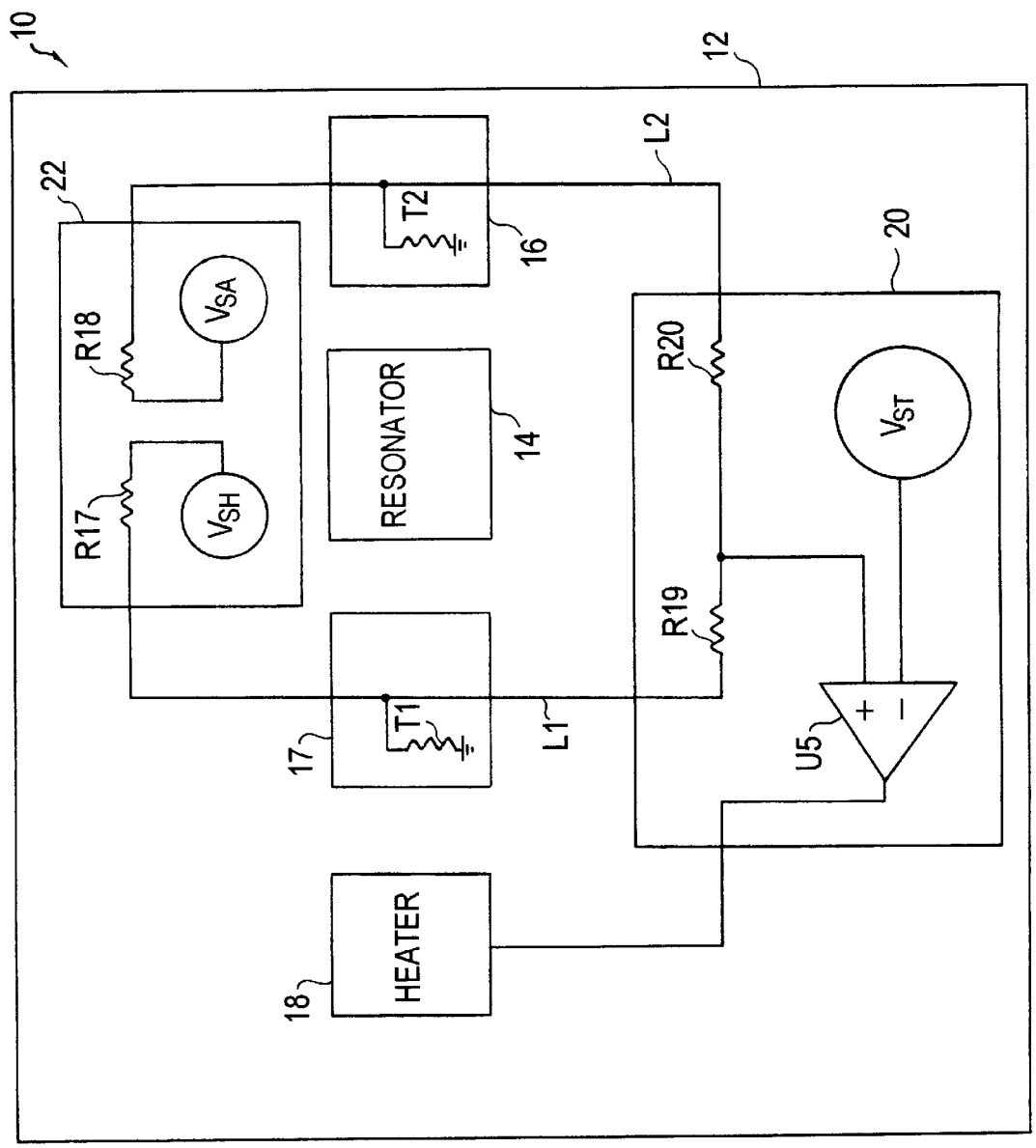
FIG. 4 is a detailed view showing an alternative embodiment of FIG. 1.

FIG. 4 is a detailed view showing another alternative embodiment of FIG. 1. Thermistors T1 and T2 have one end connected to ground and the other end connected to circuit lines L1 and L2 that are connected between adjustment circuit 22 and control circuit 20. The thermistors output a temperature signal. Adjustment circuit 22 has variable voltage sources Vsh and Vsa that are connected through resistors R17 and R18 to thermistors T1 and T2, respectively. Variable voltage sources Vsh and Vsa are varied during manufacturing to adjust the voltage levels of the temperature signals going to control circuit 20. Control circuit 20 includes resistors R19 and R20 which have ends connected to circuit lines L1 and L2, respectively. The other ends of resistors R19 and R20 are commoned and connected to the positive input of op amp U5 which functions as a loop amplifier. Variable voltage source Vst is connected to the negative input of op amp U5. Voltage source Vst is used during manufacturing to set the operating voltage level at which op amp U5 switches. The output of op amp U5 is connected to heater 18. During manufacturing, the completed assembly is powered on and allowed to warm up. The frequency output of the crystal is monitored. Variable voltage sources Vsh, Vsa and Vst are adjusted to optimize the frequency stability of the oscillator as the ambient temperature rises.

Figure 5:
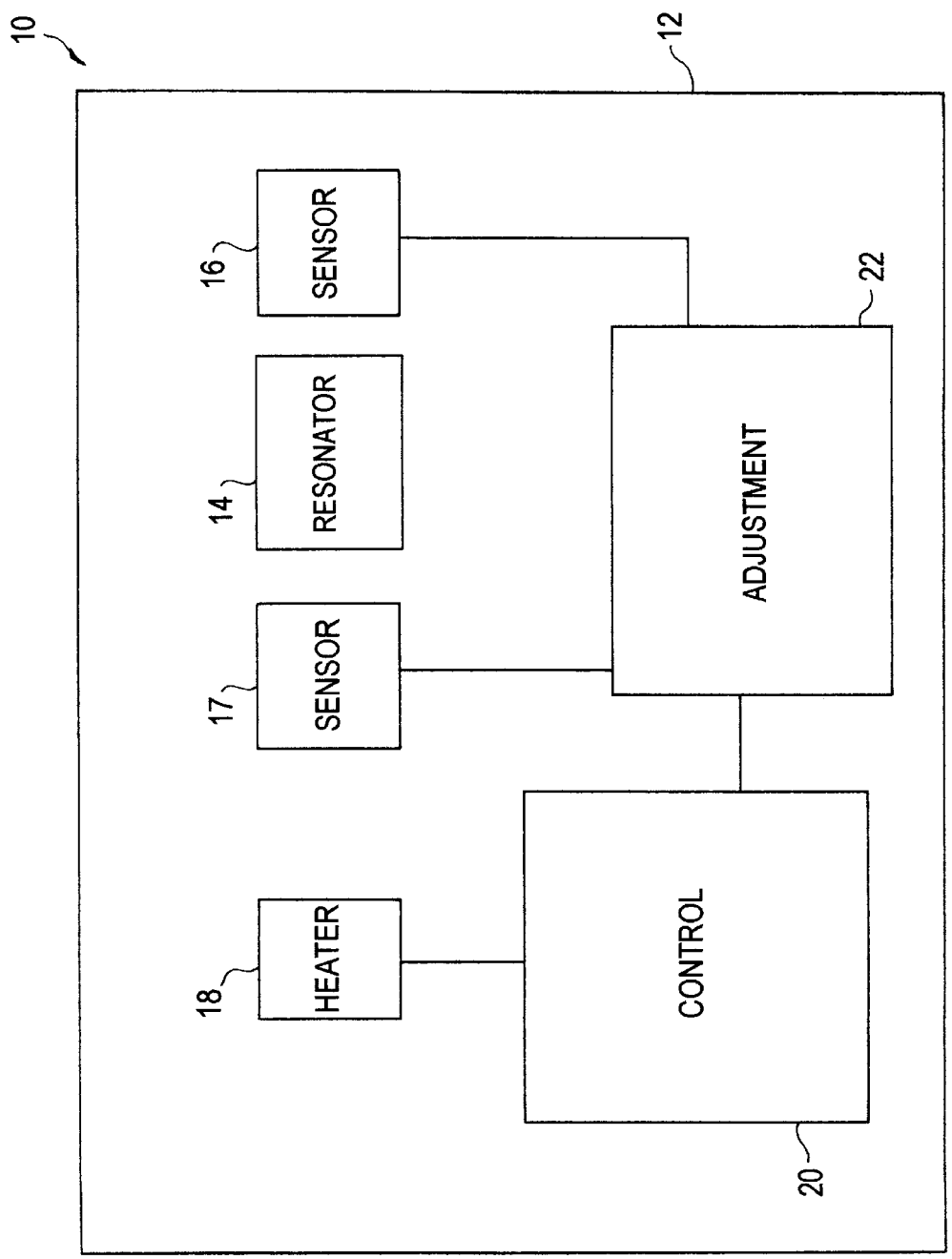
FIG. 5 is a diagrammatic view of an alternative embodiment.

FIG. 5 is a diagrammatic view of an alternative embodiment. FIG. 5 is similar to FIG. 1, except that adjustment circuit 22 is located between sensors 16 and 17 and control circuit 20.

Figure 6:
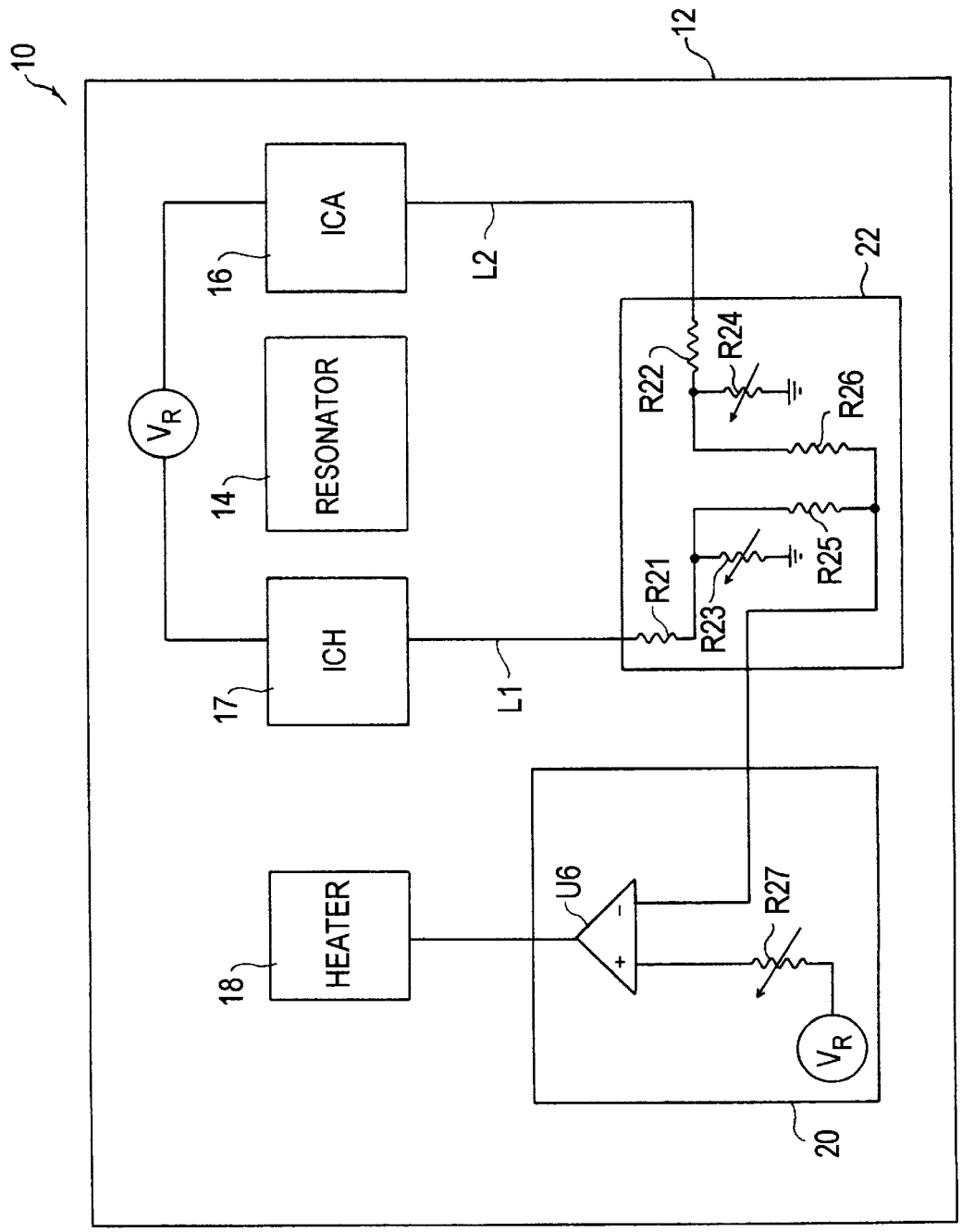
FIG. 6 is a detailed view of the alternative embodiment of FIG. 5.

FIG. 6 is a detailed view of the alternative embodiment of FIG. 5. Integrated circuit temperature sensors Ich and Ica have a pin connected to a reference voltage Vr and another pin connected to circuit lines L1 and L2 that are connected to adjustment circuit 22. The integrated circuit temperature sensors output a temperature signal. Adjustment circuit 22 has resistors R21 and R22 that have one end connected to resistors R25 and R26, respectively and the other ends connected to circuit lines L1 and L2 respectively. Variable resistors R23 and R24 are connected between resistors R21 and R25 and R22 and R26, respectively to ground. Resistors R23 and R24 are selected during manufacturing to adjust the relative voltage levels of the temperature signals going to control circuit 20. Control circuit 20 includes an op amp U6 that has resistors R25 and R26 commoned and connected to the negative input. Op amp U6 functions as the control loop amplifier. Voltage source Vr is connected through variable resistor R27 to the positive input of op amp U6. Resistor R27 is used during manufacturing to set the operating voltage level at which op amp U6 controls. The output of op amp U6 is connected to heater 18. During manufacturing, the completed assembly is powered on and allowed to warm up. The frequency output of the crystal is monitored and resistors R23, R24 and R27 are adjusted to optimize the frequency stability as the ambient varies.

Figure 7:
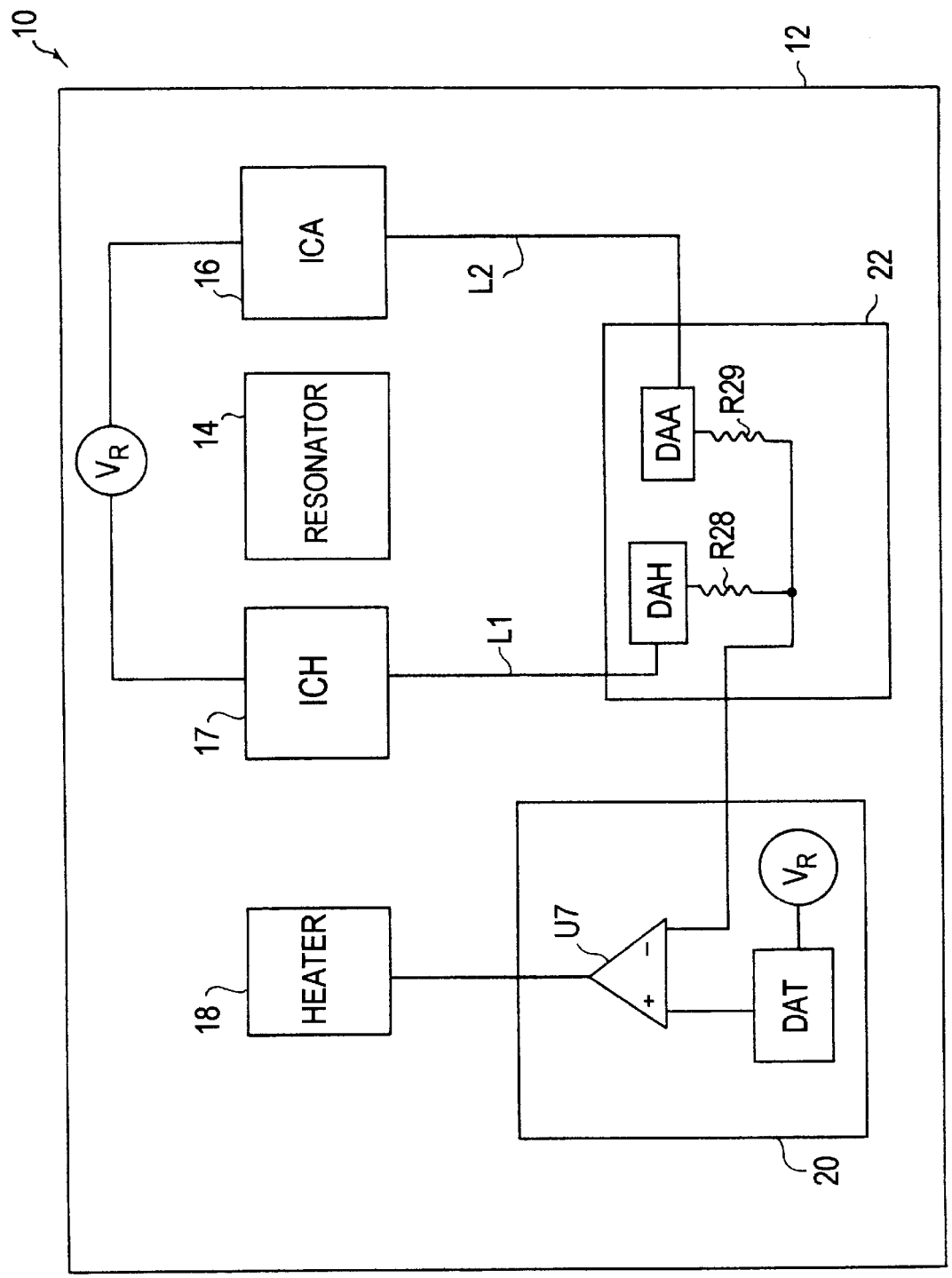
FIG. 7 is a detailed view of the alternative embodiment of FIG. 5.

FIG. 7 is a detailed view of another alternative embodiment of FIG. 5. Integrated circuit temperature sensors Ich and Ica have a pin connected to a reference voltage Vr and another pin connected to circuit lines L1 and L2 that are connected to adjustment circuit 22. The integrated circuit temperature sensors output a temperature signal. Adjustment circuit 22 has digital to analog converters DAH and DAA that output variable voltage levels and are connected to resistors R28 and R29, respectively. Digital to analog converters DAH and DAA are set during manufacturing to adjust the relative voltage levels of the temperature signals going to control circuit 20. Control circuit 20 includes an op amp U7 that has its negative input connected to commoned resistors R28 and R29. Op amp U7 functions as the loop amplifier. Digital to analog converter DAT is connected to the positive input of op amp U7. Digital to analog converter DAT is used during manufacturing to set the operating voltage level at which op amp U7 controls. The output of op amp U7 is connected to heater 18. During manufacturing, the completed assembly is powered on and allowed to warm up. The frequency output of the crystal is monitored and digital to analog converters DAA, DAH and DAT are adjusted to optimize the frequency stability as the ambient varies.

Figure 8:
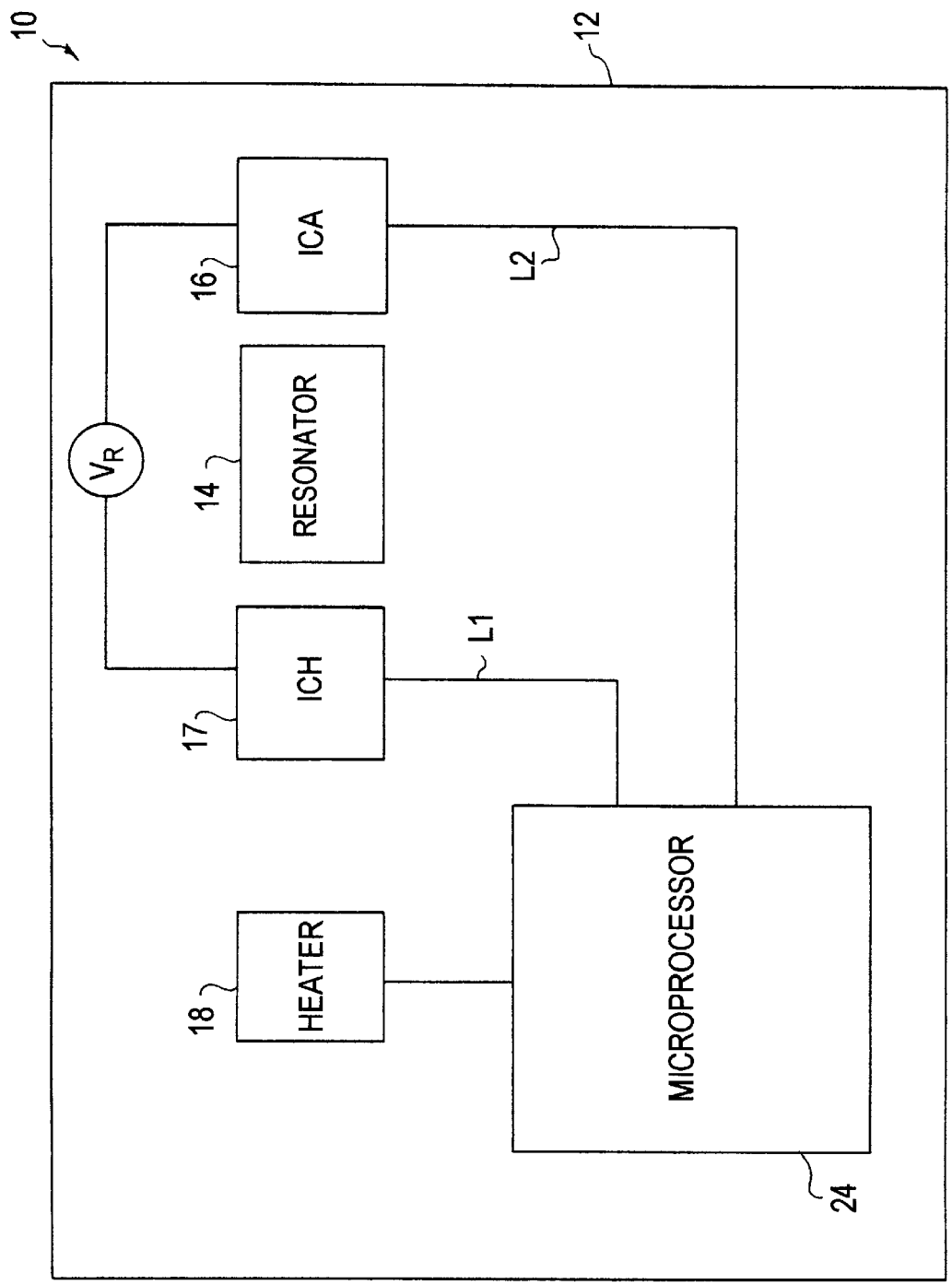
FIG. 8 is a diagrammatic view of an alternative embodiment.

FIG. 8 is a diagrammatic view of an alternative embodiment. FIG. 8 is similar to FIG. 1, except that adjustment circuit 22 and control circuit 20 are replaced by a microprocessor 24 that is located between sensors 16 and 17 and heater 18. Microprocessor 24 would be programmed during manufacturing to adjust the influence that sensors 16 and 17 have on controlling heater 18 to best stabilize the frequency output of crystal or resonator 14 as the ambient changes.

Oscillator assembly 10 would be assembled using conventional electronic manufacturing techniques. The circuitry of control mechanism 20, adjustment mechanism 22, sensors 16,17 and heater 18 are mounted on a conventional printed circuit board or ceramic substrate (not shown). The resonator 14 is typically elevated from the circuit board or substrate. The housing 12 is an insulated metal can.

Remarks on the Preferred Embodiment(s)

The Dynamic Thermal Control for Ovenized Oscillators is shown uses multiple temperature sensors, such as a thermistor, in a thermal control/feedback circuit. One thermistor is located thermally between the heater and the resonator or crystal. Another thermistor is located between the resonator or crystal and the housing which has ambient temperature on the outside. If the sensitivities of the two thermistor circuits are equal, the zero drift temperature control point or thermal pivot point will be thermally halfway between the two sensors. If the thermistors have been placed equi-distant from the crystal, this will result in the crystal blank being controlled at a constant temperature.

Inconsistencies in manufacturing of the assemblies from unit to unit, however, limit the distribution of thermal gains that can be achieved with the temperature sensors in fixed locations. But if the relative sensitivities of the thermistors are varied, it is possible to shift the locations of the thermal pivot or control point along the thermal path between sensor 16 and 17.

For example, if the sensor or thermistor 17 near the heater is used for 100% of the oven control feedback, the oven/ crystal assembly will be under-compensated with a positive thermal gain. (i.e. the crystal temperature changes in the same direction as the ambient.) Conversely, if the thermistor 16 between the crystal and the ambient is supplying 100% of the control feedback, the crystal will be over-compensated with a negative thermal gain. (i.e. the crystal will get hotter as the ambient temperature gets cooler and vice versa.)

Varying the relative ratio of influence of the two thermistors or sensors 16 and 17 will therefore move the thermal pivot point along the thermal path between them. There are several methods that could be employed to vary this sensitivity, several of which were shown in the embodiments.

The control point could therefore be virtually located at the optimum point by setting the ratios to precisely the proper value. Using a micro-computer and/or the voltage adjustment techniques would provide for fine resolution and easy automation of the optimization process. In some cases, due to temperature coefficients of other components in the oscillator circuit, the best frequency vs. temperature performance may be achieved when the temperature of the crystal is offset slightly from its true turnover point. Automation of the thermal gain adjustment could also find the optimum operating point in this case.

In order to design a control system that can be quickly optimized for maximum thermal gain, it is helpful to construct a thermal model of the assembly. Modeling with software can give a good approximation of the thermal profile and may point out some non-obvious aspects of the assembly, but the best accuracy is achieved by making actual measurements on a unit when it is operating in its normal environment. After selecting the approximate location for sensors 16 and 17 based on a preliminary analysis, a physical model or prototype is constructed for characterization in a temperature chamber.

The ovenized oscillator is best characterized by using an SC cut crystal which is tuned to operate on its "B" mode. This mode provides a very steep and linear frequency vs. temperature characteristic which will precisely indicate the temperature of the crystal blank itself. A proportional oven control circuit should be used which is damped to provide stable performance without DC feedback so that the steady-state temperature error at the control sensor is zero.

The first temperature run is performed with heater 18 disabled so that the sensors and the crystal temperatures are equal to the ambient temperature. Measurements are then taken from +95° C. to +75° C. in −1° C. increments to obtain the required calibration data. Measurements should include: the resistance of both of the thermistors, T1 and T2 and the frequency of the "B" mode oscillator.

The heater is then activated and thermistor T1 is connected to provide 100% of the control to the heater circuit. (T2 is disconnected.) The oven temperature is set near the middle of the normal operating range at about +85° C. A temperature run is then performed over the ambient range of interest, typically −30 to +75° C. in 5° C. increments. During this run, measurements are made on thermistor T2 and the "B" mode frequency so that the temperature change and gradients at those two points can be calculated.

Thermistor T1 is now disconnected from the control circuit and thermistor T2 is connected to provide 100% of the feedback. Another run is performed over −30 to +75° C. this time measuring thermistor T2 and the "B" mode frequency. The data which has been collected can now be used to calculate the thermal characteristics of the ovenized oscillator assembly and the optimum ratio to maximize the thermal gain at the crystal.

The relative ratio of influence required of the two sensors to optimize the gain is then calculated and this ratio is set by whatever means is being employed. Resistor values may be selected or the voltage applied may be adjusted. A temperature run is then performed on the unit and if required, small adjustments to fine tune the thermal gain may be subsequently made without any physical movement of the sensors.

Variations of the Preferred Embodiment(s)

One of ordinary skill in the arts of ovenized oscillator design, will realize many advantages from using the preferred embodiment. Further, one of ordinary skill in the art of making oscillators will realize that there are many different ways of accomplishing the preferred embodiment. For example, it is contemplated to that the sensors 16 and 17 could be placed in different positions within housing 12 other than the positions shown.

The embodiment showed the use of two sensors 16 and 17. More than two sensors could be placed inside housing 12.

Even though, the embodiment discusses the use of a single heater 18, it is contemplated to use more than one heater.

Even though the embodiment discusses the use of op amps and a comparator for the control means, one skilled in the art would realize that other circuit components could be used such as discrete transistors or logic gates or a micro controller.

Although, adjustment circuit 22 was illustrated as being a variable voltage source or a resistor, it is contemplated to use other electronic circuits such as logic gates.

Further, the resonator 14 could be an inverted mesa type crystal or a surface acoustical wave device or a rectangular strip type crystal or other materials.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed and desired to be secured by Letters Patent is:

1. An ovenized oscillator, comprising:
   a) a resonator;
   b) a heater, located in proximity to the resonator;
   c) a first and a second temperature sensors, located in proximity to the resonator, for sensing temperature, the first temperature sensor provides a first temperature signal, and the second temperature sensor provides a second temperature signal;
   d) control means, connected between the temperature sensors and the heater for providing a control signal to the heater, in response to the temperature sensors, that is operable to control the heater; and
   e) adjustment means, connected to each of the temperature sensors, for varying a ratio of the first and the second temperature signals that are provided to the control means such that the oscillator can produce a stable frequency.

2. The ovenized oscillator according to claim 1, wherein the control means comprises:
   a) at least two amplifiers, each connected to a temperature sensor, each amplifier having an amplifier output signal; and
   b) a loop amplifier, connected between the amplifiers and the heater, and operable to receive the amplifier output signals and a set point signal as an input and provide the control signal as an output to the heater.

3. The ovenized oscillator according to claim 1, wherein the adjustment means is an adjustable voltage source.

4. The ovenized oscillator according to claim 1, wherein the adjustment means is at least one resistor.

5. The ovenized oscillator according to claim 1, wherein the temperature sensors are thermistors.

6. The ovenized oscillator according to claim 5, wherein the ovenized oscillator is contained within a housing.

7. The ovenized oscillator according to claim 6, wherein the first temperature sensor is located between an outer wall of the housing and the resonator.

8. The ovenized oscillator according to claim 6, wherein the second temperature sensor is located between the resonator and the heater.

9. The ovenized oscillator according to claim 1, wherein the control means is a loop amplifier, connected between the temperature sensors and the heater, and operable to receive a plurality of temperature sensor signals and a set point signal as an input and provide the control signal as an output to the heater.

10. A heater control circuit for an ovenized oscillator assembly that provides a uniform temperature distribution across the oscillator assembly, comprising:
 a) a resonator;
 b) a heater, located in proximity to the resonator;
 c) a first and a second temperature sensors, located in proximity to the resonator, for sensing temperature, the first temperature sensor provides a first temperature signal, and the second temperature sensor provides a second temperature signal;
 d) control means, connected between the temperature sensors and the heater, for providing a control signal to the heater, in response to the temperature sensors, that is operable to control the heater; and
 e) adjustment means, connected between the sensors and the control means, for varying a ratio of the first and the second temperature signals that are provided to the control means such that the oscillator assembly can produce a stable frequency.

11. The heater control circuit according to claim 10, wherein the adjustment means is an adjustable voltage source.

12. The heater control circuit according to claim 10, wherein the adjustment means is at least one resistor.

13. The heater control circuit according to claim 10, wherein the temperature sensors are integrated circuit temperature sensors.

14. The heater control circuit according to claim 13, wherein the ovenized oscillator is contained within a housing.

15. The heater control circuit according to claim 14, wherein the first temperature sensor is located between an outer wall of the housing and the resonator.

16. The heater control circuit according to claim 14, wherein the second temperature sensor is located between the resonator and the heater.

17. The heater control circuit according to claim 10, wherein the control means is an amplifier that is operable to receive an adjustment means signal and a set point signal as an input and provide the control signal as an output to the heater.

18. The heater control circuit according to claim 10, wherein the control means and the adjustment means is a microprocessor that is operable to receive input signals from the temperature sensors as an input and provide the control signal as an output to the heater.

19. A heater control circuit for an ovenized oscillator assembly, comprising:

a) a resonator disposed within a housing;
 b) a heater, thermally coupled to the resonator;
 c) a first and a second thermistors, thermally coupled to the resonator, for sensing temperature, the first thermistor provides a first temperature signal, and the second thermistor provides a second temperature signal;
 d) control means, connected between the thermistors and the heater, for providing a control signal to the heater, in response to the temperature signals, the control signal operable to control the heater; and
 e) adjustment means, connected to the thermistors, for varying a ratio of the first and the second temperature signals that are provided to the control means such that the oscillator assembly can produce a stable frequency.

20. The oscillator assembly according to claim 19, wherein said adjustment means is chosen from the group consisting of:
 a) at least two resistors;
 b) a variable voltage source;
 c) at least two variable resistors; or
 d) a microprocessor.

21. The oscillator assembly according to claim 20, wherein the control means is an amplifier, connected between the thermistors and the heater, and operable to receive the temperature signals and a set point signal as an input and provide the control signal as an output.

22. A thermally enhanced ovenized oscillator assembly operable to provide a stable temperature within said assembly, said oscillator assembly mounted within an insulated housing, the improvement comprising: a resonator; a heater, located in proximity to the resonator; a first and a second temperature sensors, located in proximity to the resonator, for sensing temperature, the first temperature sensor provides a first temperature signal, and the second temperature sensor provides a second temperature signal; a control circuit, connected between the sensors and the heater for providing a control signal to the heater, in response to the sensors, that is operable to control a magnitude of power to the heater; and a variable voltage source, connected to each of the sensors, for varying a ratio of the first and the second temperature signals that are provided to the control circuit such that the oscillator assembly can produce a stable frequency.

23. The oscillator assembly according to claim 22, wherein said temperature sensors are chosen from the group consisting of:
 a) at least two thermistors; or
 b) at least two integrated circuit temperature sensors.

* * * * *